United States Patent
Yoshida et al.

(10) Patent No.: US 11,860,537 B2
(45) Date of Patent: Jan. 2, 2024

(54) POSITIVE TYPE PHOTOSENSITIVE SILOXANE COMPOSITION AND CURED FILM FORMED BY USING THE SAME

(71) Applicant: Merck Patent GmbH, Darmstadt (DE)

(72) Inventors: Naofumi Yoshida, Yokohama (JP); Megumi Takahashi, Kakegawa (JP); Katsuto Taniguchi, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 663 days.

(21) Appl. No.: 16/607,966

(22) PCT Filed: Apr. 25, 2018

(86) PCT No.: PCT/EP2018/060520
§ 371 (c)(1),
(2) Date: Oct. 24, 2019

(87) PCT Pub. No.: WO2018/197524
PCT Pub. Date: Nov. 1, 2018

(65) Prior Publication Data
US 2021/0116811 A1    Apr. 22, 2021

(30) Foreign Application Priority Data
Apr. 28, 2017 (JP) ................ 2017-090388

(51) Int. Cl.
*G03F 7/022* (2006.01)
*G03F 7/023* (2006.01)
*G03F 7/075* (2006.01)
*C08G 77/04* (2006.01)
*G03F 7/004* (2006.01)

(52) U.S. Cl.
CPC .......... *G03F 7/0226* (2013.01); *C08G 77/04* (2013.01); *G03F 7/0045* (2013.01); *G03F 7/0233* (2013.01); *G03F 7/0757* (2013.01)

(58) Field of Classification Search
CPC ..... G03F 7/0757; G03F 7/0226; G03F 7/0233
See application file for complete search history.

(56) References Cited

U.S. PATENT DOCUMENTS

| | | | | |
|---|---|---|---|---|
| 10,025,182 B2 * | 7/2018 | Tsutsumi | ............... | C08G 59/62 |
| 10,591,818 B2 * | 3/2020 | Knapp | ................. | G03F 7/0045 |
| 10,606,173 B2 * | 3/2020 | Takahashi | ................. | G03F 7/20 |
| 2005/0095530 A1 * | 5/2005 | Hosaka | .................. | G03F 7/0048 430/270.1 |
| 2013/0216952 A1 * | 8/2013 | Yokoyama | ............ | G03F 7/0757 430/286.1 |
| 2015/0050596 A1 | 2/2015 | Wu et al. | | |
| 2015/0293449 A1 | 10/2015 | Wu et al. | | |
| 2015/0378256 A1 | 12/2015 | Wu et al. | | |
| 2017/0023859 A1 * | 1/2017 | Tsutsumi | ................ | C08G 59/20 |
| 2017/0102613 A1 * | 4/2017 | Shibui | ........................ | G03F 7/30 |
| 2018/0031970 A1 * | 2/2018 | Arimoto | ................ | C08G 73/22 |
| 2019/0113845 A1 * | 4/2019 | Yorisue | ................ | C09D 179/08 |

FOREIGN PATENT DOCUMENTS

| | | |
|---|---|---|
| EP | 1813985 A1 | 8/2007 |
| EP | 2799928 A1 | 11/2014 |
| JP | 2013114238 A | 6/2013 |
| JP | 5233526 B2 | 7/2013 |
| WO | WO-2017144148 A1 | 8/2017 |
| WO | WO-2018034460 A1 | 2/2018 |

OTHER PUBLICATIONS

International Search Report for PCT/EP2018/060520 dated Aug. 14, 2018.
International Search Report for PCT/EP2018/060540 dated Aug. 20, 2018.
Written Opinion of the International Searching Authority for PCT/EP2018/060520 dated Aug. 14, 2018.
Written Opinion of the International Searching Authority for PCT/EP2018/060540 dated Aug. 20, 2018.

* cited by examiner

*Primary Examiner* — John S Chu
(74) *Attorney, Agent, or Firm* — Faegre Drinker Biddle & Reath LLP

(57) ABSTRACT

[Object] To provide a positive type photosensitive composition capable of forming a cured film having high transparency [Means] The present invention provides a positive type photosensitive siloxane composition comprising: a polysiloxane, a diazonaphthoquinone derivative, an additive having a >N—C(=O)— or >N—C(=S)— structure and the capability of interacting with the polysiloxane, and a solvent. The polysiloxane and the additive interact with each other before exposure, but they lose the interaction after exposure.

20 Claims, No Drawings

POSITIVE TYPE PHOTOSENSITIVE SILOXANE COMPOSITION AND CURED FILM FORMED BY USING THE SAME

CROSS-REFERENCE TO APPLICATIONS

This application is a national stage application (under 35 U.S.C. § 371) of PCT/EP2018/1060520, filed Apr. 25, 2018, which claims benefit of Japanese Application No. 2017-090388, filed Apr. 28, 2017, both of which are incorporated herein by reference in their entirety.

TECHNICAL FIELD

The present invention relates to a positive type photosensitive siloxane composition. Further, this invention also relates to a cured film formed from the composition and to a device comprising the cured film.

BACKGROUND ART

In the field of displays or optical devices, it is general to form a highly transparent film on a surface of a display or the like. For example, a planarization film is generally formed on a surface of a flat panel display (FPD) or the like. As a material of the planarization film, polysiloxanes are attracting attention. In fact, there are many reports on photosensitive compositions thereof in combination with photosensitive agents.

Those photosensitive compositions are required to be highly sensitized. However, if the content of the photosensitive agent is increased to meet the requirement, the resultant film is impaired in transparency by the agent contained therein. That is a dilemma. In view of that, researches are made on photosensitive agents capable of realizing high transparency, but even so there is still room for improvement.

PRIOR ART DOCUMENTS

Patent Documents

[Patent document 1] Japanese Patent No. 5233526
[Patent document 2] Japanese Patent Laid-Open No. 2013-114238

DISCLOSURE OF INVENTION

Problem to be Solved by the Invention

The present invention aims to solve the above problem remaining to be improved in the prior art, and specifically aims to provide a positive type photosensitive composition capable of forming a cured film having a high remaining film ratio, high photosensitivity and high transparency.

Means for Solving Problem

The present invention provides a positive type photosensitive siloxane composition comprising: (I) a polysiloxane comprising a repeating unit represented by the following formula (Ia):

$$\{O_{0.5}-\underset{\underset{O_{0.5}}{|}}{\overset{\overset{R^1}{|}}{Si}}-O_{0.5}\} \quad (Ia)$$

in which
R$^1$ is hydrogen, a mono- to trivalent saturated or unsaturated straight, branched or cyclic aliphatic hydrocarbon group of C$_1$ to $_{30}$, or a mono- to trivalent aromatic hydrocarbon group of C$_{6\ to\ 30}$;
provided that
in said aliphatic or aromatic hydrocarbon group,
one or more methylene is substituted with oxy, imido or carbonyl, or unsubstituted,
one or more hydrogen is substituted with fluorine, hydroxy or alkoxy, or unsubstituted, and
one or more carbon is substituted with a silicon, or unsubstituted; and further
provided that, if R$^1$ is a di- or trivalent group, R$^1$ links Si atoms contained in the plural repeating units; (II) a diazonaphthoquinone derivative, (III) an additive selected from the group consisting of compounds having >N—C(=O)— or >N—C(=S)— structures and not having any other binding sites for said polysiloxane, and (IV) a solvent.

The present invention also provides a cured film formed from the above positive type photosensitive siloxane composition.

The present invention further provides an electronic device comprising the above cured film.

Effect of the Invention

The positive type photosensitive siloxane composition according to the present invention makes it possible to form a cured film having such a high remaining film ratio, high photosensitivity and high transparency as to serve suitably as a protective film or the like of an electronic device.

BEST MODE FOR CARRYING OUT THE INVENTION

Embodiments of the present invention will be explained below in detail.

Unless otherwise stated in the present specification, the numerical range shown by "A to B" includes the values A and B of both ends and they are expressed in terms of common units. For example, "5 to 25 mol %" means 5 mol % or more but 25 mol % or less.

Also in the present specification, "C$_{x\ to\ y}$", "C$_x$ to C$_y$" or "C$_x$" means the number of carbon atoms contained in the molecule or in the substituent. For example, "an alkyl group of C$_{1\ to\ 6}$" means an alkyl group having 1 or more but 6 or less carbon atoms (such as, methyl, ethyl, propyl, butyl, pentyl or hexyl). Further in the present specification, "a fluoroalkyl group" means an alkyl group in which one or more hydrogen is substituted with fluorine and "a fluoroaryl group" means an aryl group in which one or more hydrogen is substituted with fluorine.

Also, unless otherwise stated in the present specification, "an alkyl group" means a straight- or branched-chain alkyl group and "a cycloalkyl group" means an alkyl group having a cyclic structure. The "cycloalkyl group" includes an alkyl group having a cyclic structure which contains a straight- or branched-chain alkyl substituent. The term "hydrocarbon group" means a group containing monovalent, divalent or higher carbon and hydrogen and further, if necessary, oxygen or nitrogen. The term "aliphatic hydrocarbon group" means a straight, branched or cyclic aliphatic hydrocarbon group, and the "aromatic hydrocarbon group" means a group which contains an aromatic ring and may have, if necessary, an aliphatic hydrocarbon substituent. The aliphatic or aromatic hydrocarbon group may contain, if necessary, fluorine, oxy, hydroxy, amino, carbonyl or silyl group.

In the present specification, if a polymer comprises two or more kinds of repeating units, those repeating units are copolymerized. The copolymerization may be any of alternating copolymerization, random copolymerization, block copolymerization, graft copolymerization or mixture thereof unless otherwise stated.

Also, unless otherwise stated, the temperature in the present specification is represented by Celsius degrees. For example, "20° C." means the temperature of 20 Celsius degrees.

<Positive Type Photosensitive Siloxane Composition>

The positive type photosensitive siloxane composition according to the present invention comprises:

(I) a polysiloxane,
(II) a diazonaphthoquinone derivative,
(III) a particular additive,
(IV) a solvent, and
(V) an optional component.

Those components are individually described below.

[(I) Polysiloxane]

The term "polysiloxane" generally means a polymer having Si—O—Si bonds (siloxane bonds) as the main chain. In the present specification, the polysiloxane includes a silsesquioxane polymer represented by the formula $(RSiO_{1.5})_n$.

The polysiloxane according to the present invention comprises a repeating unit represented by the following formula (Ia):

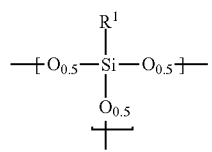

(Ia)

In the above formula, $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$. In the aliphatic or aromatic hydrocarbon group, one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted. If $R^1$ is a di- or trivalent group, $R^1$ links Si atoms contained in the plural repeating units.

Examples of a monovalent group adoptable as $R^1$ include: (i) an alkyl group, such as, methyl, ethyl, propyl, butyl, pentyl, hexyl, heptyl, octyl, or decyl; (ii) an aryl group, such as, phenyl, tolyl, or benzyl; (iii) a fluoroalkyl group, such as, trifluoromethyl, 2,2,2-trifluoroethyl, or 3,3,3-trifluoropropyl; (iv) a fluoroaryl group; (v) a cycloalkyl group, such as, cyclohexyl; (vi) a nitrogen-containing group having an amino or imido structure, such as, glycidyl, isocyanate or amino; and (vii) an oxygen-containing group having an epoxy, acryloyl or methacryloyl structure, such as, glycidyl. Preferred are methyl, ethyl, propyl, butyl, pentyl, hexyl, phenyl, tolyl, glycidyl, and isocyanate. As the fluoroalkyl group, a pentafluoroalkyl group is preferred. Particularly preferred are trifluoromethyl and pentafluoroethyl. The compound in which $R^1$ is methyl is preferred because the starting materials thereof are easily available and further because the resultant cured film has high hardness and high chemical resistance. If $R^1$ is phenyl, the polysiloxane has such high solubility in the solvent that the resultant cured film hardly suffers from cracks. Accordingly, phenyl is also preferred. Further, $R^1$ preferably has hydroxy, glycidyl, isocyanate or amino because those groups improve adhesion between the cured film and the substrate.

Preferred examples of the di- or trivalent group adoptable as $R^1$ include: groups containing alkylene, arylene, cycloalkylene ring, piperidine ring, pyrrolidine ring or isocyanurate ring.

If necessary, the polysiloxane according to the present invention may further comprise a repeating unit represented by the following formula (Ib):

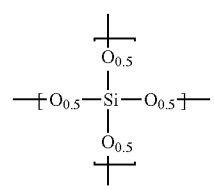

(Ib)

The above polymer contains a silanol group at the terminal

The above polysiloxane can be produced by hydrolyzing and condensing the silane compound represented by the following formula (ia), if necessary, in the presence of an acidic or basic catalyst.

 $R^1[Si(OR^2)_3]_p$ (ia).

In the formula,
p is 1 to 3; and
$R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$. In the aliphatic or aromatic hydrocarbon group, one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted.

Further, $R^2$ is an alkyl group of $C_{1\ to\ 10}$.

If the silane compound of the formula (ia) is adopted, the polysiloxane can be so produced as to consist of only the repeating unit of the formula (Ia). However, the compound of the formula (ia) can be used in combination with the silane compound represented by the following formula (ib) to produce another polysiloxane, which contains the repeating units of the formulas (Ia) and (Ib).

 $Si(OR^2)_4$ (ib)

Here, it is possible to employ two or more kinds of the silane compound (ia) in combination with two or more kinds of the silane compound (ib).

If the starting material mixture for producing the polysiloxane contains the silane compound (ib) in a large amount, it may be deposited or the formed coating film may deteriorate in photosensitivity. Accordingly, the blending ratio of the silane compound (ib) in the mixture is preferably 40 mol % or less, further preferably 20 mol % or less based on the total moles of silane compounds used as the starting materials for producing the polysiloxane.

The polysiloxane normally has a weight average molecular weight of 500 to 25000 inclusive. However, in view of solubility in an organic solvent and an alkali developer, the weight average molecular weight is preferably 1000 to 20000 inclusive. Here, the molecular weight is represented in terms of polystyrene reduced value, and can be measured by gel permeation chromatography based on polystyrene.

The polysiloxane according to the present invention has an alkali dissolution rate (hereinafter, often referred to as "ADR", described later in detail) which varies according to the thickness of the formed film, to the development conditions, and to the kind and the amount of the photosensitive agent incorporated in the composition. However, for example, if having a thickness of 0.1 to 10 μm (1000 to 100000 Å), the formed film preferably has a dissolution rate of 50 to 5000 Å/second in a 2.38 wt % aqueous solution of tetramethylammonium hydroxide (TMAH).

In the present invention, for the purpose of controlling the photosensitivity, a polysiloxane having a higher ADR than usual is preferably used in combination with the particular additive described later so that the exposed area and the unexposed area may be very different in solubility. The polysiloxane having a high ADR generally forms a pattern which has high photosensitivity according to the high ADR but which tends to have a poor remaining film ratio after development. However, in the present invention, since the polysiloxane having a high ADR is used in combination with the particular additive, the remaining film ratio can be improved while the photosensitivity is kept high. It is preferred that the polysiloxane has a high ADR since the effect of the invention can be fully obtained. For example, the photosensitivity can be improved by 10% or more.

The composition according to the present invention may comprise a combination of two or more kinds of polysiloxanes different, for example, in ADR or in average molecular weight. Different polysiloxanes can be produced by changing the conditions, such as, catalyst, reaction temperature, reaction time and polymer. If polysiloxanes different in ADR are employed in combination, it becomes possible to reduce pattern reflow and undissolved residues left after development and thereby to improve pattern stability.

The polysiloxane is, for example,
(M): a polysiloxane which forms a film soluble in a 2.38 wt % TMAH aqueous solution at a dissolution rate of 200 to 3000 Å/second after prebaked.

If necessary, it may be mixed with
(L): a polysiloxane which forms a film soluble in a 5 wt % TMAH aqueous solution at a dissolution rate of 1000 Å/second or less after prebaked, or
(H): a polysiloxane which forms a film soluble in a 2.38 wt % TMAH aqueous solution at a dissolution rate of 4000 Å/second or more after prebaked,
to prepare a composition having a desired dissolution rate.

The polysiloxanes (M), (H) and (L) individually have weight average molecular weights described above.

In order to enlarge the aforementioned difference in solubility, it is possible to control the blending ratio of two polysiloxanes having different ADRs.

The polysiloxane adopted in the present invention has a branched structure because the compound (ia) or (ib) is employed as the starting material. If necessary, those starting materials can be used in combination with a two-functional silane compound so that the resultant polysiloxane may partly have a straight-chain structure. However, if high heat-resistance is necessary for use, the polysiloxane preferably contains a straight-chain structure in a small amount. Specifically, the straight-chain structure derived from the two-functional silane compound is contained preferably in an amount of 30 mol % or less based on the whole polysiloxane structure.

(Measurement and Calculation of Alkali Dissolution Rate (ADR))

The alkali dissolution rates given by the polysiloxanes and a mixture thereof are measured and calculated in the following manner, where a TMAH aqueous solution is adopted as an alkali solution.

First, the polysiloxane is diluted with propyleneglycol monomethyletheracetate (hereinafter, referred to as "PGMEA") to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and spin-coated to form a coating film of 2±0.1 μm thickness. Thereafter, the coating film is heated for 90 seconds on a hot-plate at 100° C. to remove the solvent. The thickness of the coating film is then measured with a spectro-ellipsometer (manufactured by J.A. Woollam).

Subsequently, the silicon wafer covered with the coating film is placed in a 6 inch-diameter glass petri dish filled with 100 ml of a TMAH aqueous solution of predetermined concentration at 23.0±0.1° C., and left to be immersed. The time it takes for the coating film to disappear is measured. The dissolution rate is obtained by dividing the initial thickness of the coating film by the time it takes for the coating film to dissolve and disappear in the area from the wafer edge to 10-mm inside. Otherwise, if the dissolution rate is extremely slow, the wafer is immersed in the TMAH aqueous solution for a predetermined time and then heated for 5 minutes on a hot-plate at 200° C. to remove water soaked in the coating film during the measurement of dissolution rate, and thereafter the thickness of the coating film is measured. The thickness change between before and after the immersion is divided by the immersing time to obtain the dissolution rate. The measurement is repeated five times and the obtained values are averaged to determine the dissolution rate of the polysiloxane.

[(II) Diazonaphthoquinone Derivative]

The siloxane composition according to the present invention contains a diazonaphthoquinone derivative as a photosensitive agent. Since the composition contains the photosensitive agent, it is possible to fabricate a patterned cured film by exposure and development and hence it is unnecessary to pattern the film by use of dry etching or the like. Accordingly, the composition of the invention has the advantage of reducing damage to the circuit or the elements during a process of manufacturing a device.

The positive type photosensitive siloxane composition of the present invention comprises a diazonaphthoquinone derivative serving as a photosensitive agent. This composition forms a positive type photosensitive layer, in which a part in the exposed area becomes soluble in an alkali developer and hence is removed by development.

The diazonaphthoquinone derivative functioning as a photosensitive agent in the present invention is a compound in which a naphthoquinone diazide sulfonic acid is esterbonded with a phenolic hydroxy-containing compound. There are no particular restrictions on the structure thereof, but the derivative is preferably an ester compound formed by esterification of a compound having one or more phenolic hydroxy groups. Examples of the naphthoquinone diazide sulfonic acid include: 4-naphthoquinone diazide sulfonic acid and 5-naphthoquinone diazide sulfonic acid. Because of having an absorption band in the i-line region (wavelength: 365 nm), 4-naphthoquinone diazide sulfonate is suitable for i-line exposure. On the other hand, 5-naphthoquinone diazide sulfonate is suitable for exposure in a wide wavelength range because absorbing light in a wide wavelength region. Accordingly, it is preferred to select 4-naphthoquinone diazide sulfonate or 5-naphthoquinone diazide sulfonate according to the exposure wavelength. It is also possible to use both 4-naphthoquinone diazide sulfonate and 5-naphthoquinone diazide sulfonate in a mixture.

There are no particular restrictions on the phenolic hydroxy-containing compound. Examples thereof include: bisphenol A, BisP-AF, BisOTBP-A. Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, and TrisP-TC ([trademark], manufactured by Honshu Chemical Industry Co., Ltd.).

The optimal amount of the diazonaphthoquinone derivative depends on the esterification ratio of naphthoquinone diazide sulfonic acid, on properties of the adopted polysiloxane, on the required photosensitivity and on the required dissolution contrast between the exposed and unexposed areas. However, it is preferably 1 to 20 weight parts, more preferably 3 to 15 weight parts, based on 100 weight parts of the polysiloxane. If the amount is 1 weight part or more, the dissolution contrast between the exposed and unexposed areas is high enough to obtain favorable photosensitivity. For realizing more favorable dissolution contrast, the amount is preferably 5 weight parts or more. On the other hand, however, the less the diazonaphthoquinone derivative is contained, the more the resultant cured film is improved in colorless transparency and hence the higher transmittance the film has. That is preferred.

[(III) Particular Additive]

The composition according to the present invention contains a particular additive. The particular additive (III) is considered to be a compound having such an interaction with the polysiloxane as to decrease the ADR of the polysiloxane. Here, the "interaction" means an intermolecular force interaction, such as, hydrogen bond, ionic bond or dipole interaction. The above intermolecular force interaction is caused by a particular nitrogen-containing structure. The additive is a compound having a >N—C(=O)— or >N—C(=S)— structure. On the other hand, in the photolithographic process for forming a pattern, the additive has a function of increasing solubility of the polysiloxane in the exposed area. As a result, a high contrast can be obtained without increasing the photosensitive agent.

In a coating film formed from the composition of the present invention, nitrogen contained in the >N—C(=O)— or >N—C(=S)— structure is considered to interact with oxygen in the polysiloxane and consequently to form a weak bond. Meanwhile, in a coating film formed from a known positive type photosensitive composition containing diazonaphthoquinone, the diazonaphthoquinone serves as a dissolution inhibitor in the unexposed area. The particular additive according to the present invention is considered to assist it in inhibiting dissolution. Specifically, the interaction between the particular additive and the polysiloxane is so weak as to be cancelled by acid generated in the coating film as a result of exposure, and hence the difference of polysiloxane dissolution rate is enlarged between in the exposed area and in the unexposed area. The contrast of the resultant pattern is thus thought to be enhanced. In this way, the particular additive according to the present invention is presumed to assist the photosensitive agent in controlling the photosensitivity.

As described above, it is preferred that there is the interaction between the particular additive and the polysiloxane until the composition is exposed and the interaction is lost by acid generated by light after the composition is exposed In order to realize the preferred interaction, the particular additive preferably has a particular structure. Specifically, the additive (III) necessarily has a >N—C (=O)— or >N—C(=S)— structure. Examples thereof include: >N—C(=O)—N<(urea structure), >N—C(=S)—N<(thiourea structure), >N—C(=O)—O (urethane structure), >N—C(=O)—S— (thiourethane structure), >N—C(=O)— (amide structure), and >N—C(=S)— (thioamide structure).

In addition to the above structure, the additive (III) may contain any other structure as long as it does not impair the effect of the present invention. However, in order that the interaction between the additive (III) and the polysiloxane may bring about favorable effects, it is not preferred for the additive (III) to have a functional group or the like which forms a stronger bond with the polysiloxane than the particular nitrogen-containing structure. If the functional group or the like forms the strong bond, the aimed interaction is so inhibited that dissolution is not promoted in the exposed area. As a result, the film may suffer from undissolved residues formed in the development process or from unevenness of development. Accordingly, the additive (III) preferably does not have a binding site or functional group capable of forming a stronger bond with the polysiloxane than the particular nitrogen-containing structure. Specifically, the additive (III) preferably contains neither an alkoxysilyl group nor a hydroxysilyl group.

The interaction between the additive (III) and the polysiloxane may be influenced by substituents of the additive (III) or the like. Further, if the additive (III) has a bulky substituent, the substituent may interfere with the interaction between the >N—C(=O)— or >N—C(=S)— structure and the polysiloxane. Those are preferably taken into account when the substituents in the additive (III) are selected.

In the process for forming the cured film, the additive is left in the unexposed area of the coating film. In view of that, the additive (III) preferably decomposes or vaporizes at a low temperature, for example, at room temperature or at a temperature lower than the curing temperature of the coating film.

Specifically, the additive according to the present invention is preferably represented by one of the following formulas (III-i) to (III-iv):

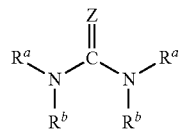

(III-i)

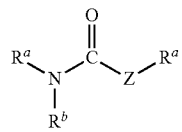

(III-ii)

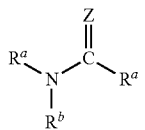
(III-iii)

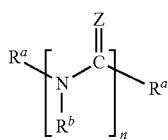
(III-iv)

In the formula, Z is oxygen or sulfur; and each $R^a$ is independently hydrogen or a straight, branched or cyclic alkyl group of $C_{1\ to\ 20}$. In the alkyl group, one or more methylene is substituted or oxy or carbonyl, or unsubstituted, one or more hydrogen is substituted with alkoxy, or unsubstituted, and one or more carbon is substituted with a silicon, or unsubstituted. Each $R^b$ is independently hydrogen or an alkyl group of $C_{1\ to\ 4}$, provided that two $R^b$s in (III-ii) may form a cyclic structure; and n is an integer of 1 to 3. The group $R^a$ is preferably neither an alkoxysilyl group nor a hydroxysilyl group. Among the above, preferred is the additive represented by the formula (III-i).

In the above formula,
Z is preferably oxygen, and
$R^a$ is preferably an alkyl, silyl, alkylsilyl, alkylsilylalkyl or silylalkyl group, more preferably an alkyl or alkylsilylalkyl group of $C_{3\ to\ 10}$.

In the formula (III-i), at least one of the two $R^b$s is preferably hydrogen and both are more preferably hydrogens. If at least one $R^b$ is hydrogen, the effect of the present invention tends to be enhanced.

Any of the formulas (III-i) to (III-iv) preferably contains no hydroxysilyl group.

Specific examples of the additive (III) include: 1,3-di(trimethylsilyl)urea, 1,3-di(methylsilylmethyl)urea, and

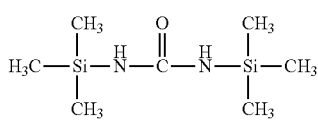
(III-1)

Other preferred examples of the additive (III) represented by the formula (III-i) include: urea, thiourea, methylurea, ethylurea, 1-acetyl-2-thiourea, 1-methyl-2-thiourea, 1-ethyl-2-thiourea, 1,1-dimethylurea, 1,1-diethylurea, 1,3-dimethylurea, 1,3-diethylurea, 1,3-dimethyl-2-thiourea, 1,3-diethyl-2-thiourea, 1,3-dipropyl-2-thiourea, 1,3-diisopropyl-2-thiourea, 1,3-di-n-butyl-2-thiourea, 1,3-di-tert-butyl-2-thiourea, 1-(sec-butyl)-3-methylurea, 1-isobutyl-3-methylurea, 1-butyl-3-ethylurea, 1-ethyl-3-propylurea, 1-methyl-3-propyl-2-thiourea, ethyleneurea, propyleneurea, ethylenethiourea, 1,1,3-trimethylurea, 1,1,3-trimethylthiourea, N,N'-dimethylethyleneurea, N,N'-dimethylpropyleneurea, N,N,N',N'-tetramethylurea, N,N-dimethyl-N',N'-diethylurea, N,N-dimethyl-N',N'-diphenylurea, and methoxymethylurea.

Preferred examples of the additive (III) represented by the formula (III-ii) include: ethyl carbamate, tert-butyl carbamate, ethyl N-phenylcarbamate, ethyl N-dimethylphenylcarbamate, 2-(1-methylpropyl)phenyl N-methylcarbamate, and N,N'-methylenedicyclohexyl-ethyl dicarbamate.

Preferred examples of the additive (III) represented by the formula (III-iii) include: N,N-dimethylformamide, acetamide, N,N-dimethylacetamide, propionamide, benzamide, acetanilide, benzanilide, N-methylacetanilide, and N,N-dimethylthioformamide.

The preferred amount of the additive (III) is determined according to the content of the >N—C(=O)— or >N—C(=S)— structures in the compound. Specifically, the additive (III) is preferably incorporated in such an amount that the content of the structures may be 0.1 to 5 weight parts, preferably 1.0 to 4.0 weight parts based on 100 weight parts of the polysiloxane in the composition. The composition containing the additive (III) in an amount of the above range tends to have high photosensitivity and tends to be capable of forming a pattern of high transparency.

In the present invention, two or more kinds of the additives (III) may be used in combination.

[(IV) Organic Solvent]

The composition according to the present invention contains an organic solvent, which is selected from solvents capable of evenly dissolving or dispersing the components in the composition. Examples of the organic solvent include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ether, such as, propylene glycol monomethyl ether (PGME) and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; and alcohols, such as, isopropanol, and propanediol. Those solvents can be used singly or in combination of two or more, and the amount thereof depends on the coating method and on the required thickness of the coating film. For example, in a spray coating process, the amount of the solvent is often 90 wt % or more based on the total weight of the polysiloxane and the optional component. However, when a slit-coating method is adopted in coating a large glass substrate for producing a display, the solvent amount is normally 50 wt % or more, preferably 60 wt % or more but normally 90 wt % or less, preferably 85 wt % or less.

[(V) Optional Component]

The composition of the present invention may contain other optional components, if necessary. Examples of the optional components include curing promoters. As the curing promoters, compounds generating acid or base under exposure of light or heat are often adopted. Phot acid-generator, photo base-generator, thermal acid-generator, thermal base generator, photo thermal acid-generator and photo thermal base-generator can be exemplified. The photo thermal acid-generator or photo thermal base-generator can be the compound which changes the chemical structure under exposure of light without generating acid or base, and then generate acid or base by bond cleavage caused by heat. They are selected according to polymerization reactions or crosslinking reactions conducted in the process for producing the cured film. Here, the "light" is, for example, visible light, UV rays or IR rays. The curing promoter is preferably a compound generating acid or base under exposure of UV rays employed for manufacturing thin film transistors.

The amount of the curing promoter depends on the kind of the active substance released by decomposition of the curing promoter, on the amount of the released substance, on the required photosensitivity and on the required dissolution contrast between the exposed and unexposed areas. However, the amount is preferably 0.001 to 10 weight parts, more preferably 0.01 to 5 weight parts, based on 100 weight parts of the polysiloxane. If the amount is 0.001 weight part or more, the dissolution contrast between the exposed and unexposed areas is high enough to obtain a favorable effect of the curing promoter. On the other hand, if it is 10 weight parts or less, the formed film hardly suffers from cracks and is not colored by decomposition of the curing promoter, so that the coating film is improved in colorless transparency.

Examples of the photo acid-generator include: diazomethane compounds, triazine compounds, sulfonic acid esters, diphenyliodonium salts, triphenylsulfonium salts, sulfonium salts, ammonium salts, phosphonium salts, and sulfonimide compounds.

Specific examples of the employable photo acid-generator include: 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsente, 4-methoxyphenyldiphenylsulfonium-p-toluenesulfonate, 4-phenylthiophenyldiphenyl tetrafluoroborate, 4-phenylthiophenyldiphenyl hexafluorophosphonate, triphenylsulfonium methanesulfonate, triphenylsulfonium trifluoroacetate, triphenylsulfonium-p-toluenesulfonate, 4-methoxyphenyldiphenylsulfonium tetrafluoroborate, 4-phenylthiophenyldiphenyl hexafluoroarsenate, 4-phenylthiophenyldiphenyl-p-toluenesulfonate, N-(trifluoromethylsulfonyloxy)succinimide, N-(trifluoromethylsulfonyloxy)phthalimide, 5-norbornene-2,3-dicarboxyimidyl triflate, 5-norbornene-2,3-dicarboxyimidyl-p-toluenesulfonate, 4-phenylthiophenyldiphenyl trifluoromethanesulfonate, 4-phenylthiophenyldiphenyl trifluoroacetate, N-(trifluoromethylsulfonyloxy)diphenylmaleimide, N-(trifluoromethylsulfonyloxy)bicyclo[2.2,1]hept-5-ene-2,3-dicarboximide, N-(trifluoromethylsulfonyloxy) naphthylimide, and N-(nonaflurorobutylsulfonyloxy) naphthylimide.

Examples of the photo base-generator include: multi-substituted amido compounds having amido groups, lactams, imido compounds, and compounds containing the structures thereof. Further, also usable are ion-type photo base-generators, which contain anions, such as, amide anion, methide anion, borate anion, phosphate anion, sulfonate anion and carboxylate anion. Examples of the photo thermal base-generator represented by the following formula (PBG):

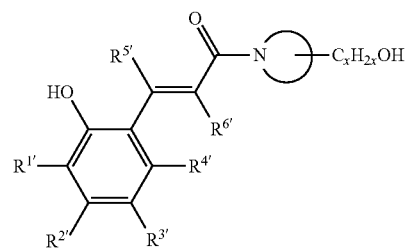

(PBG)

In the formula, x is an integer of 1 to 6 inclusive, and each of $R^{1'}$ to $R^{6'}$ is independently hydrogen, a halogen, hydroxy, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of $C_{1\ to\ 20}$ which may have a substituent, an aromatic hydrocarbon group of $C_{6\ to\ 22}$ which may have a substituent, an alkoxy group of $C_{1\ to\ 20}$ which may have a substituent, or an aryloxy group of $C_{6\ to\ 20}$ which may have a substituent.

Among the above, each of $R^{1'}$ to $R^{4'}$ is preferably independently hydrogen, hydroxy, an aliphatic hydrocarbon group of $C_{1\ to\ 6}$ or an alkoxy group of $C_{1\ to\ 6}$; and each of $R^{5'}$ and $R^{6'}$ is particularly preferably hydrogen.

Two or more of $R^{1'}$ to $R^{4'}$ may be linked to form a cyclic structure, and the cyclic structure may contain a hetero atom.

In the above formula, N is a constituting atom of a nitrogen-containing heterocyclic ring, which is a 3- to 10-membered ring. The nitrogen-containing heterocyclic ring may have one or more substituents different from $C_xH_{2x}OH$ shown in the formula (PBG), and may further have an aliphatic hydrocarbon group of $C_{1\ to\ 20}$, particularly of $C_{1\ to\ 6}$.

Each of $R^{1'}$ to $R^{4'}$ is preferably selected according to the employed exposure wavelength. For use in a display device, preferred are alkoxy groups, nitro group and unsaturated hydrocarbon-linking functional groups, such as vinyl and alkynyl, which have a function of shifting the absorption wavelength to the g-, h- or i-line region. Among them, methoxy and ethoxy are particularly preferred.

Specific examples are as follows:

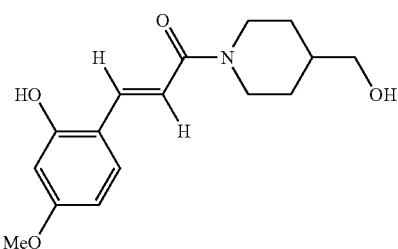

PBG-1

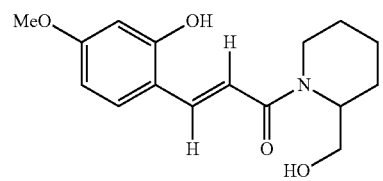

PBG-2

-continued

PBG-3
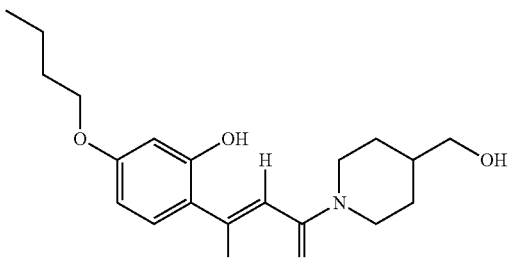

PBG-4
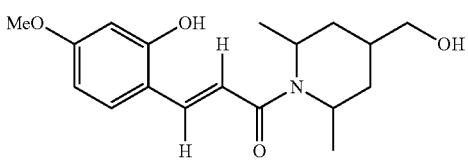

PBG-5
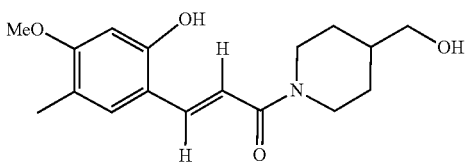

The photo thermal base-generator represented by the formula (PBG) is preferably used in the form of a hydrate or solvate. If the photo thermal base-generator is used in the form of an anhydrate, the effect often cannot be fully obtained. Here, the "anhydrate" means a compound that is neither hydrated nor solvated. There are no particular restrictions on how to hydrate or solvate an anhydrate of the photo thermal base-generator, and known methods can be adopted. For example, the photo thermal base-generator anhydrate is added to water or a solvent under the condition where the amount of water or solvent is 10 times or more by weight of that of the anhydrate, and then the solution is stirred for about 1 hour at room temperature or above. For forming the solvate, the solvent is preferably capable of both dissolving the photo thermal base-generator and being dissolved in water and also preferably has a boiling point lower than water. Examples of the solvent include THF and alcohols of $C_6$ or less. Subsequently, excess of the solvent is distilled off from the obtained mixture with an evaporator, to obtain the hydrate or solvate. It can be verified by infrared (IR) absorption spectroscopy, by $^1$H-NMR or by thermogravimetry differential thermal analysis (TG-DTA) whether or not the resultant product is hydrated or solvated.

In another way, the photo thermal base-generator in the form of an anhydrate may be mixed with water or solvent, stirred and then directly used without isolating the hydrate or solvate.

The amount of water for hydration or solvent for solvation is 0.1 mol or more, preferably 1 mol or more based on 1 mol of the photo thermal base-generator represented by the formula (PBG).

The curing promoter may be a thermal acid-generator or a thermal base-generator. Examples of the thermal acid-generator include: various aliphatic sulfonic acids and salts thereof; various aliphatic carboxylic acids, such as, citric acid, acetic acid and maleic acid, and salts thereof; various aromatic carboxylic acids, such as, benzoic acid and phthalic acid, and salts thereof; aromatic sulfonic acids and ammonium salts thereof; various amine salts; aromatic diazonium salts; and phosphonic acid and salts thereof. Among those salts or esters capable of generating organic acids, salts of organic acids and organic bases are preferred, and further preferred are salts of sulfonic acids and organic bases.

Examples of the preferred sulfonic acids include: p-toluenesulfonic acid, benzenesulfonic acid, p-dodecylbenzenesulfonic acid, 1,4-naphthalenedisulfonic acid, and methanesulfonic acid. Those thermal acid-generators can be used singly or in mixture.

Examples of the thermal base-generator include: compounds generating bases, such as, imidazoles, tertiary amines, and quaternary ammoniums; and mixtures of those compounds. Examples of the generated bases include: imidazole derivatives, such as, N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitrobenzyloxycarbonyl)imidazole; and 1,8-diazabicyclo[5,4,0]undecene-7. Those base-generators as well as the acid-generators can be used singly or in mixture.

Examples of the optional components also include surfactants.

The composition according to the present invention preferably contains a surfactant because the surfactant improves coating properties. The surfactants usable in the composition of the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene alcohol derivatives, such as, polyethoxyate of acetylene alcohol; acetylene glycols; acetylene glycol derivatives such as polyethoxyate of acetylene glycol; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 10000 ppm, preferably 100 to 5000 ppm based on the total weight of the photosensitive siloxane composition.

<Cured Film and Electronic Device Comprising the Cured Film>

The cured film according to the present invention can be produced by coating a substrate with the above-described positive type photosensitive siloxane composition and then curing the formed coating film.

The coating film can be formed from the composition of the present invention by a known coating method, such as, immersion coating, roll coating, bar coating, brush coating, spray coating, doctor coating, flow coating, spin coating, or slit coating. Those are conventionally known as methods for applying a photosensitive siloxane composition. The substrate can be also appropriately selected from, for example, a silicon substrate, a glass substrate or a resin film. If the substrate is in the form of a film, gravure coating can be carried out. If desired, a drying step can be independently carried out after coating. Further, according to necessity, the coating step may be repeatedly carried out once or twice or more so as to form a coating film of desired thickness.

After formed from the photosensitive siloxane composition of the present invention, the coating film is preferably subjected to prebaking (preheating treatment) for the purposes of drying the film and of reducing the solvent remaining therein. The prebaking step is carried out at a temperature of generally 70 to 150° C., preferably 90 to 120° C. for 10 to 180 seconds, preferably 30 to 90 seconds on a hot-plate or for 1 to 30 minutes in a clean oven.

Since the composition of the present invention is photosensitive, it can form a patterned cured film. The method for forming a pattern is explained below. In order to form a desired pattern, a coating film is formed from the composition of the present invention, then prebaked, and subsequently pattern-wise exposed to light. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. Energy of the exposure light depends on the light source and the initial thickness of the coating film, but is generally 10 to 2000 mJ/cm$^2$, preferably 20 to 1000 mJ/cm$^2$. If the exposure energy is lower than 10 mJ/cm$^2$, the composition decomposes insufficiently. On the other hand, if it is more than 2000 mJ/cm$^2$, the coating film is exposed so excessively that the exposure may cause halation.

In order that the coating film can be pattern-wise exposed to light, common photomasks are employable. Those photomasks are known to those skilled in the art. The exposure can be carried out under an ambient atmosphere (the normal atmosphere) or under a nitrogen atmosphere. If the cured film is intended to be formed on the whole surface of the substrate, the whole film surface is exposed to light. In the present invention, the term "pattern film" includes a film thus formed on the whole surface of the substrate.

As a developer used in the development step, it is possible to adopt any developer employed in developing conventional photosensitive siloxane compositions. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), ammonia, alkylamine, alkanolamine, or heterocyclic amine. A particularly preferred alkali developer is an aqueous solution of tetraalkylammonium hydroxide. Those alkali developers may further contain surfactants or water-soluble organic solvents, such as, methanol and ethanol, if necessary. After developed with an alkali developer, the film is normally washed with water. Subsequently, the film is normally subjected to entire surface exposure (flood exposure). The entire surface exposure photo-decomposes unreacted molecules of the diazonaphthoquinone derivative remaining in the film, and thereby improves light-transparency of the film. Accordingly, if intended to be used as a transparent film, the film is preferably subjected to entire surface exposure. If incorporated as the curing promoter, the photo acid- or base-generator receives light and releases acid or base, respectively, in the entire surface exposure step. If incorporated as the curing promoter, the photo thermal acid- or the photo thermal base-generator receives light and changes the chemical structure.

In the overall exposure, the whole film surface is exposed to light at an exposure dose of 100 to 2000 mJ/cm$^2$ (in terms of reduced amount of exposure at 365 nm) by use of a UV-visible exposure unit, such as, PLA.

After developed, the pattern film is heated to cure. The heating temperature is not particularly restricted as long as the film can be cured, but normally 150 to 400° C., preferably 200 to 350° C. If it is lower than 150° C., the silanol groups tend to remain unreacted. The silanol groups generally have such polarity as to often induce high permittivity, and hence the film is preferably cured at a temperature of 200° C. or above if the permittivity is intended to be lowered.

The cured film according to the present invention has high transparency. Specifically, the transmittance thereof is preferably 90% or more, further preferably 95% or more at 400 nm.

The cured film thus produced can be advantageously used for various applications. For example, it can be adopted as a planarization film, an interlayer insulating film or a transparent protective film employed in various devices such as flat panel displays (FPDs), and also is employable as an interlayer insulating film for low temperature polysilicon or as a buffer coating film for IC chips. Further, the cured product can be used as an optical device element.

EXAMPLES

The present invention will be further specifically explained by use of the following examples.

Synthesis Example 1 (Synthesis of Polysiloxane (M))

In a 2-L flask equipped with a stirrer, a thermometer and a condenser, 32.5 g of a 25 wt % TMAH aqueous solution, 800 ml of isopropyl alcohol (IPA) and 2.0 g of water were placed. Independently, 39.7 g of phenyltrimethoxysilane, 34.1 g of methyltrimethoxysilane and 7.6 g of tetramethoxysilane were mixed to prepare a mixed solution, which was then placed in a dropping funnel. The mixed solution was dropped into the flask at 10° C., and successively the obtained mixture was stirred at the same temperature for 3 hours. Subsequently, 10% HCl aqueous solution was added to neutralize the mixture, and then 400 ml of toluene and 100 ml of water were added into the neutralized mixture, so that the mixture was separated into two layers. The organic layer was collected and condensed under reduced pressure to remove the solvent. To the obtained concentrate, PGMEA was added so that the solid content might be 40 wt %. The molecular weight (in terms of polystyrene reduced value) of the obtained polysiloxane (M) was measured to find the weight average molecular weight (Mw)=1800. Further, a silicon wafer was coated with the obtained resin solution so that the formed film might have a thickness of 2 μm after prebaked. Thereafter, the dissolution rate in a 2.38 wt % TMAH aqueous solution was measured and found to be 1200 Å/second.

The reaction conditions were changed to synthesize the polysiloxanes (H) and (L). The polysiloxane (H) was found to have a weight average molecular weight (Mw) of 1500, and the dissolution rate thereof in a 2.38 wt % TMAH aqueous solution was found to be 10000 Å/second. The polysiloxane (L) was found to have a weight average molecular weight (Mw) of 2500, and the dissolution rate thereof in a 5% TMAH aqueous solution was found to be 300 Å/second.

Example 101 and Comparative Examples 101 to 104

Various additives were combined and dissolved in PGMEA to prepare siloxane compositions of Example 101 and Comparative examples 101 to 104. The ingredients of each composition are shown in Table 1. In the table, the value of each polysiloxane means a blending ratio by weight and the amounts of the particular additive, the photosensitive agent and the curing promoter are shown in terms of weight parts based on 100 weight parts of the polysiloxanes in total.

The additives are as follows: diazonaphthoquinone derivative (DNQ):
4,4'-(1-(4-(1-(4-hydroxyphenol)-1-methylethyl)-phenyl)ethylidene)bisphenol modified with 2.0 mol of diazonaphthoquinone, curing promoter:
1,8-naphthalimidyl triflate (NAI-105 [trademark], manufactured by Midori Kagaku Co., Ltd.), surfactant:
KF-53 ([trademark], manufactured by Shin-Etsu Chemical Co., Ltd.),
III-1: N,N'-bis(trimethylsilyl)urea,
III-R1: 1,1-di(2-phenoxyethoxy)cyclohexane, and
III-R2: N,N'-bis(3-trimethoxysilylbutyl)urea.

The photosensitivity was regarded as such exposure energy that the obtained composition could form a 1:1 line-and-space pattern of 3 μm after development. The remaining film ratio was also regarded as the ratio of the film thickness after development to that before development. The pattern shape was evaluated and categorized into the following grades:

A: the pattern kept clear lines and the film reduction after development was minor, B: the pattern was hollowed at the base or the film reduction after development was serious, and C: the top or side surface of the pattern was roughened, and residues were left to make the pattern contrast unclear.

Further, cured films were produced in the following manner. A 4-inch silicon wafer was spin-coated with each composition to form a coating film of 2.5 μm thickness. The obtained film was prebaked for 90 seconds at 100° C. to evaporate the solvent. The dried film was then subjected to pattern-exposure at 120 to 160 mJ/cm$^2$ by use of a g+h+i line mask aligner (PLA-501F [trademark], manufactured by Canon Inc.), thereafter subjected to paddle development for 60 seconds with a 2.38 wt % TMAH aqueous solution, and finally rinsed with pure water for 60 seconds. Further, the film was subjected to flood exposure at 1000 mJ/cm$^2$ by use of the g+h+i line mask aligner, and then heated to cure at 230° C. for 30 minutes.

The transmittances of the cured films thus obtained were individually measured at 400 nm with a MultiSpec-1500 ([trademark], manufactured by Shimadzu Corporation). The results are shown in Table 1.

TABLE 1

| | | Example | Comparative examples | | | |
|---|---|---|---|---|---|---|
| | | 101 | 101 | 102 | 103 | 104 |
| (I) polysiloxane | (H) | 43 | 34 | 43 | 26 | 39 |
| (blending ratio by | (M) | 26 | 26 | 26 | 26 | 26 |
| weight) | (L) | 31 | 40 | 31 | 48 | 35 |
| (II) DNQ | | 8 | 8 | 8 | 8 | 8 |
| (III) additive | compound | IIIb-1 | — | III-R1 | III-R2 | — |
| | amount | 10 | — | 10 | 10 | — |
| curing aid | | 1 | 1 | 1 | 1 | 1 |
| ADR of (I) | | 1500 | 500 | 1500 | 100 | 1000 |
| photosensitivity (mJ/cm$^2$) | | 112 | 160 | 132 | 160 | dissolved, |
| pattern shape | | A | A | B | A | no |
| remaining film ratio (%) | | >99 | >99 | 79 | >99 | residual |
| transmittance (%) | | 96.4 | 96.6 | dissolved, clouded | 96.3 | film left |
| content of nitrogen-containing structure (phr) | | 2.06 | — | 0 | 1.09 | — |

In the table, the "content of nitrogen-containing structure" means the weight part of the >N—C(=O)— or >N—C(=S)— structures contained in the additive(III) based on 100 weight parts of the polysiloxane.

The coating film of Comparative example 102 was partly dissolved and the surface thereof was clouded after development. The coating film of Comparative example 104 was dissolved and not left after development.

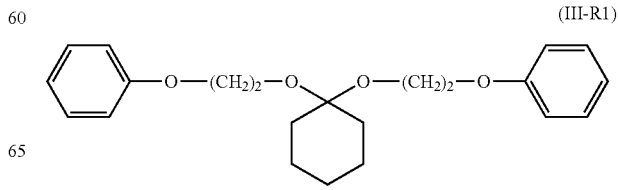

(III-R1)

-continued (III-R2)

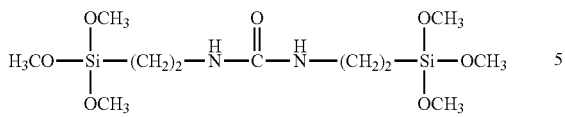

From the obtained results, the composition according to the present invention was verified to make it possible to realize high transparency, high photosensitivity and a high remaining film ratio after development.

The invention claimed is:

1. A positive type photosensitive siloxane composition comprising:
   (I) a polysiloxane is produced by hydrolyzing and condensing a silane compound represented by the following formula (ia), $$R^1[Si(OR^2)_3]_p \qquad (ia)$$

wherein
   p is 1 to 3; and
   $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$;
   $R^2$ is an alkyl group of $C_{1\ to\ 10}$,
   provided that,
   in said aliphatic or aromatic hydrocarbon group,
   one or more methylene is substituted with oxy, imido or carbonyl, or unsubstituted,
   one or more hydrogen is substituted with fluorine, hydroxy or alkoxy, or unsubstituted, and
   one or more carbon is substituted with a silicon, or unsubstituted; and further provided that, if $R_1$ is a di- or trivalent group, $R^1$ links Si atoms contained in the plural repeating units;
   (II) a diazonaphthoquinone derivative;
   (III) an additive selected from the group consisting of compounds having >N—C(=O)— or >N—C(=S)— structures and not having any other binding sites for said polysiloxane, and the additive contains two substitutents $R^1$, wherein each $R^1$ is independently silyl, alkylsilyl, alkylsilylalkyl or silylalkyl group, and the additive does not contain an alkoxysilyl group or hydroxysilyl group;
   (IV) a solvent and
   (V) a photoacid generator.

2. The composition according to claim 1, wherein said polysiloxane further comprises a
   silane compound represented by the following formula (ib), $$Si(OR^2)_4 \qquad (ib)$$

wherein $R^2$ is an alkyl group of $C_{1\ to\ 10}$.

3. The composition according to claim 1, wherein said polysiloxane forms, after prebaking, a film having a dissolution rate of 200 to 5000 Å/second in a 2.38 wt % aqueous solution of tetramethylammonium hydroxide.

4. The composition according to claim 1, wherein said additive (III) is in an amount of 0.1 to 5 weight parts based of 100 weight parts of said polysiloxane.

5. The composition according to claim 1, wherein said additive (III) is represented by one selected from the group consisting of the following formulas (III-i) to (III-iv):

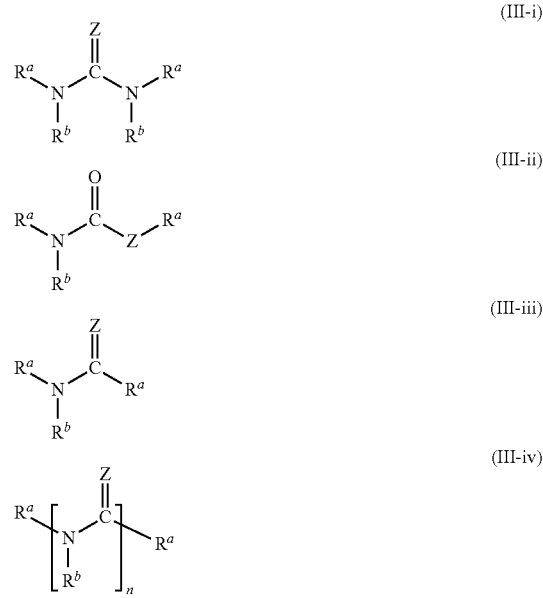

in which
Z is oxygen or sulfur;
each $R^1$ is independently silyl, alkylsilyl, alkylsilylalkyl or silylalkyl group,
provided that
in said alkyl group,
one or more methylene is substituted with oxy or carbonyl, or unsubstituted,
one or more hydrogen is substituted with alkoxy, or unsubstituted, and
one or more carbon is substituted with a silicon, or unsubstituted;
each $R^R$ is independently hydrogen or an alkyl group of $C_{1\ to\ 4}$, provided that two $R^b$s in (III-ii) may form a cyclic structure; and
n is an integer of 1 to 3.

6. A cured film comprising a substrate and a coating formed from the positive type photosensitive siloxane composition according to claim 1.

7. The cured film according to claim 6, having a light transmittance of 90% or more at a wavelength of 400 nm.

8. In an electronic device wherein the improvement comprises the cured film according to claim 6.

9. A positive type photosensitive siloxane composition comprising:
   (I) a polysiloxane is produced by hydrolyzing and condensing a silane compound represented by the following formula (ia), $$R^1[Si(OR^2)_3]_p \qquad (ia)$$

wherein
   p is 1 to 3; and
   $R^1$ is hydrogen, a mono- to trivalent saturated or unsaturated straight, branched or cyclic aliphatic hydrocarbon group of Ci to 30, or a mono- to trivalent aromatic hydrocarbon group of $C_{6\ to\ 30}$;
   $R^2$ is an alkyl group of $C_{1\ to\ 10}$,
   provided that,
   in said aliphatic or aromatic hydrocarbon group,
   one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted; and further provided that, if $R^1$ is a di- or trivalent group, $R^1$ links Si atoms contained in the plural repeating units;

(II) a diazonaphthoquinone derivative;

(III) an additive selected from the group consisting of compounds having >N—C(═O)— or >N—C(═S)— structures and not having any other binding sites for said polysiloxane, with the proviso that the additive is not a thiourea and the additive contains two substitutents $R^a$, wherein each $R^a$ is independently silyl, alkylsilyl, alkylsilylalkyl or silylalkyl group, and the additive does not contain an alkoxysilyl group or hydroxysilyl group; and (IV) a solvent and (V) a photoacid generator.

10. The composition according to claim 9, wherein said polysiloxane further comprises a-silane compound represented by the following formula (ib), $$Si(OR^2)_4 \qquad (ib)$$

wherein $R^2$ is an alkyl group of $C_{1\ to\ 10}$.

11. The composition according to claim 9, wherein said polysiloxane forms, after prebaking, a film having a dissolution rate of 200 to 5000 Å/second in a 2.38 wt % aqueous solution of tetramethylammonium hydroxide.

12. The composition according to claim 9, wherein said additive (III) is in an amount of 0.1 to 5 weight parts based of 100 weight parts of said polysiloxane.

13. The composition according to claim 9, wherein said additive (III) is represented by one selected from the group consisting of the following formulas (III-i) to (III-iv):

(III-i)

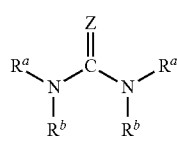

(III-ii)

(III-iii)

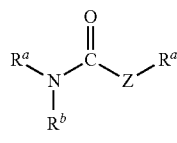

(III-iv)

in which

Z is oxygen or sulfur;

each $R^a$ is independently silyl, alkylsilyl, aslkylsilylalkyl or silylalkyl group, provided that in said alkyl group, one or more methylene is substituted with oxy or carbonyl, or unsubstituted, one or more hydrogen is substituted with alkoxy, or unsubstituted, and one or more carbon is substituted with a silicon, or unsubstituted;

each $R^b$ is independently hydrogen or an alkyl group of $C_{1\ to\ 4}$, provided that two $R^b$s in (III-ii) may form a cyclic structure; and n is an integer of 1 to 3 contains neither an alkoxysilyl group nor a hydroxysilyl group.

14. A cured film comprising a substrate and a coating formed from the positive type photosensitive siloxane composition according to claim 9.

15. The cured film according to claim 14, having a light transmittance of 90% or more at a wavelength of 400 nm.

16. In an electronic device wherein the improvement comprises the cured film according to claim 14.

17. A positive type photosensitive siloxane composition comprising:

(I) a polysiloxane is produced by hydrolyzing and condensing a silane compound represented by the following formula (ia),

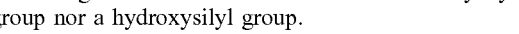

wherein p is 1 to 3; and $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$;

$R^2$ is an alkyl group of $C_{1\ to\ 10}$, provided that, in said aliphatic or aromatic hydrocarbon group, one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted; and further provided that, if $R^1$ is a di- or trivalent group, $R^1$ links Si atoms contained in the plural repeating units;

(II) a diazonaphthoquinone derivative;

(III) an additive compound which has >N—C(═O)— structures and not having any other binding sites for said polysiloxane and the additive contains two substituents Ra, wherein each Ra is independently silyl, alkylsilyl, alkylsilylalskyl, or silylalkyl group, and the additive does not contain an alkoxysilyl group or hydroxysilyl group;

(IV) a solvent and (V) a photoacid generator.

18. The composition according to claim 17, wherein said polysiloxane further comprises a-silane compound represented by the following formula (ib), $$Si(OR^2)_4 \qquad (ib)$$

wherein $R^2$ is an alkyl group of $C_{1\ to\ 10}$.

19. A cured film comprising a substrate and a coating formed from the positive type photosensitive siloxane composition according to claim 17.

20. In an electronic device wherein the improvement comprises the cured film according to claim 19.

* * * * *